United States Patent [19]
Brigham et al.

[11] Patent Number: 5,972,235
[45] Date of Patent: Oct. 26, 1999

[54] PLASMA ETCHING USING POLYCARBONATE MASK AND LOW PRESSURE-HIGH DENSITY PLASMA

[75] Inventors: Kristin Brigham, San Francisco; Chungdee Pong, Cupertino, both of Calif.

[73] Assignee: Candescent Technologies Corporation, San Jose, Calif.

[21] Appl. No.: 08/808,364

[22] Filed: Feb. 28, 1997

[51] Int. Cl.[6] .................................. H01J 9/02; B44C 1/22
[52] U.S. Cl. .................................. 216/49; 216/5; 216/55; 216/62; 216/72; 216/75; 216/79
[58] Field of Search .................................. 216/62, 66, 68, 216/72, 75, 77, 79, 80, 55, 42, 49, 4, 5, 24, 25

[56] References Cited

U.S. PATENT DOCUMENTS

| | | | |
|---|---|---|---|
| 4,665,006 | 5/1987 | Sachder et al. | 430/270 |
| 4,731,155 | 3/1988 | Napoli et al. | 156/643 |
| 5,578,185 | 11/1996 | Bergeron et al. | 205/123 |

FOREIGN PATENT DOCUMENTS

WO 94/28569  12/1994  WIPO .

OTHER PUBLICATIONS

"Damage Formed by Electron Cyclotron Resonance Plasma Etching on a Gallium Arsenide Surface"; Hara et. al., J. Appl. Phys. 67 (6), Mar. 15, 1990, pp. 2836–2839.

Hopwood, J., "Review of inductively coupled plasmas for plasma processing" *Plasma Sources Sci. Technol.* 1:109–116 (1992).

Horiike, Y., "Issues and Future Trends for Advanced Dry Etching" The Electrochemical Society, Incorporated, Proceedings of the Fourth International Symposium on Ultra Large Scale Integration Science and Technology *ULSI Science and Technology* (1993).

Sze, S., "Dry Etching" Semiconductor Devices Physics and Technology, Bell Telephone Laboratories, Inc. (1985) pp. 457–465.

*Primary Examiner*—Benjamin L. Utcoh
*Assistant Examiner*—George Goudreau
*Attorney, Agent, or Firm*—Skjerven, Morrill, MacPherson, Franklin & Friel LLP; Ronald J. Meetin; Elaine H. Lo

[57] ABSTRACT

Provided is a method of etching an etch layer using a polycarbonate layer as a mask. The method includes placing an etch structure in a reaction chamber, the etch structure including an etch layer underlying a polycarbonate layer, the polycarbonate layer having apertures. The etch layer is then etched using a low pressure-high density plasma generate at a pressure in the range of approximately 1 to 30 millitorr where the ionized particle concentration is at least $10^{11}$ ions/cm$^3$ and where the ionized particle concentration is substantially equal throughout the volume of the reaction chamber. To increase the etch rate, the etch structure can be heated or biased. To decrease the etch rate, an inert gas can be added to the process gas mixture used to form the plasma.

45 Claims, 9 Drawing Sheets

5,972,235

PLASMA ETCHING USING POLYCARBONATE MASK AND LOW PRESSURE-HIGH DENSITY PLASMA

FIELD OF THE INVENTION

This invention relates to plasma etching.

BACKGROUND OF THE INVENTION

Thin film etching processes fall into two broad categories. One category is conventional liquid phase chemical etching or "wet etching". The other is gas phase plasma-assisted etching or "dry etching".

There are two primary types of dry etch mechanisms: (a) a physical mechanism and (b) a chemical reaction mechanism. In the physical etch mechanism, ions are extracted from a glow discharge and accelerated towards an etch structure whose surface is eroded by momentum transfer upon being hit by the ions. The etch structure typically includes a layer to be etched ("etch layer"), an overlying patterned layer that serves as an etch mask, and an underlying supporting substructure. In the chemical reaction etch mechanism, a glow discharge is employed to generate chemically active ions which diffuse to the etch structure where they react with the surface of the etch structure to produce volatile products.

An important factor related to the type of mechanism used in the etch process is selectivity. Selectivity is a measure of etch rates of different materials. Dry etch processes in which different materials are etched at approximately the same rate are referred to as nonselective. These processes typically use physical etch mechanisms. Dry etch processes in which different materials are etched at substantially different rates are referred to as selective. Some selective etch processes use chemical reaction mechanisms in which chemically reactive ions preferentially react with one material over another. In other selective etch processes, etched material is preferentially redeposited on one material over another.

In some dry etch processes, both types of etch mechanisms are present. In these processes, chemically active ions are extracted from a glow discharge and accelerated toward the etch structure. As a result, the surface of the etch structure is etched by momentum transfer and by chemical reaction.

Reactive ion etching (RIE) is an example of a dry etch process in which both types of etch mechanisms are present. Chemically active ions (reactive ions) are accelerated towards an etch structure which is etched by momentum transfer upon being hit by the reactive ions and by chemical reaction with the reactive ions.

A conventional RIE reactor is schematically shown in FIG. 1. The RIE reactor in FIG. 1 includes a reaction chamber 10 and an electrode 12 capacitively coupled to a high frequency power generator. An etch structure 14 is placed on electrode 12. In operation, a suitable feed gas is introduced into reaction chamber 10, and a glow discharge, shown as region 16, is formed. Since electrons are more mobile than ions, electrode 12 acquires a negative self-bias voltage. Positively charged ions are attracted to electrode 12 and etch structure 14, and reactive ion etching occurs.

A cross-sectional view of a typical etch structure in which a mask 20 overlies an etch layer 22 is shown in FIG. 2a for an RIE process. Mask 20 defines apertures 24 through which etch layer 22 is etched. FIG. 2b is an expanded cross-sectional view illustrating the reactive ion etch of a single aperture 24 in FIG. 2a. $R^+$ represents reactive ions in FIG. 2b. As reactive ions $R^+$ travel through mask aperture 24, they collide with the aperture side walls and with other gas molecules. The collisions result in physical and reactive etching as well as recombination with free electrons. As shown, item 26 identifies a region of physical etching, item 28 identifies a region of reactive etching, and item 30 identifies a region of ion-electron recombination.

A deficiency in the reactive ion concentration occurs near the surface of etch layer 22 in apertures with high aspect (depth/width) ratios. Since etch rates are dependent upon reactive ion concentration, the deficiency results in a relatively low etch rate of etch layer 22. This low etch rate, in combination with the relatively high etch rate for mask 20 due to the substantial reactive ion concentration near the aperture opening, results in a loss of selectivity in the etch between etch layer 22 and mask 20 in apertures with high aspect ratios.

Recently there is a trend towards use of low pressure-high density plasmas in dry etch processes. As the name suggests, low pressure-high density plasmas are characterized by high densities of charged and excited species at low pressures. This trend is fueled as minimum feature sizes are reduced to submicrometer dimensions, and aspect ratios increase. Horiike, "Issues and future trends for advanced dry etching," ESC Conference, May 1993 (19 pages), discusses present issues and future trends of dry etching processes employing inductively coupled plasma (ICP), electron cyclotron resonance (ECR), and helicon wave technologies.

In ECR technology, microwave energy is coupled to the natural resonant frequency of electron gas in the presence of a static magnetic field. A conventional ECR waveguide apparatus is schematically shown in FIG. 3. The apparatus includes a waveguide 40 which directs microwave energy 42 into a reaction chamber 50. Process gases are fed into reaction chamber 50. Reaction chamber 50 is surrounded by one or more coils 46 which produce an axial magnetic field. An etch structure 48 is located within reaction chamber 50. Intense electron acceleration is experienced in an ECR layer 52 which sustains the plasma.

In helicon wave technology, a plasma is magnetized longitudinally, and coupling is achieved by a radio frequency (RF) transverse electromagnetic helicon wave. A conventional helicon wave plasma apparatus is schematically shown in FIG. 4. An antenna 60 is used to couple power into a reaction chamber 62. Reaction chamber 62 is surrounded by one or more coils 64 which produce an axial magnetic field. Electrons which resonate with the phase velocity of the helicon wave are accelerated and sustain the plasma. An etch structure 66 is located within reaction chamber 62.

In ICP technology, an inductive element is used to couple energy from an RF power source to ionize gas. A conventional ICP apparatus using a spiral coupler is schematically shown in FIG. 5. The apparatus includes an inductive element 70 to which an RF power source is connected. Inductive element 70 is separated from a reaction chamber 72 by a quartz vacuum window 74. An etch structure 76 is located within reaction chamber 72. As RF current flows through inductive element 70, a time varying RF magnetic flux induces a solenoidal RF electric field within reaction chamber 72. This inductive electric field accelerates free electrons and sustains the plasma. The ICP apparatus shown in FIG. 5 is also referred to as a transformer coupled plasma (TCP) apparatus.

Bassiere et al, PCT Patent Publication WO 94/28569, discloses a method of manufacturing microtips display devices using heavy ion lithography. The method uses a mask that typically consists of polycarbonate for etching a metal gate layer. Bassiere et al cites RIE as an example of an etch process which can be used to etch the gate layer metal. However, use of RIE to etch high aspect ratio apertures inevitably results in substantial degradation of the mask layer due to the dominant nonselective physical etch mechanism. It is desirable to have a process for selectively etching an etch layer, and in particular a metal gate layer, using a polycarbonate mask without significantly eroding the polycarbonate mask.

SUMMARY OF THE INVENTION

In accordance with the present invention, a method is provided for etching an etch layer using a polycarbonate layer as an etch mask. The method includes placing an etch structure in a reaction chamber. The etch structure includes an etch layer underlying a polycarbonate layer through which apertures extend.

The etch layer is then etched through the apertures using a low pressure-high density plasma. The low pressure-high density plasma is generated at a pressure of approximately 1 to 30 millitorr, preferably 1 to 20 millitorr, with the ionized particle concentration being at least $10^{11}$ ions/cm$^3$. Also, the ionized particle concentration is substantially the same throughout the entire volume of the reaction chamber.

At low pressure, the mean free path (MFP) of reactive ions increases. This increases the reactive ion concentration at the etch layer which, in turn, increases etch selectivity. By using the etch method of the invention, nearly 100% etch selectivity between the etch layer and the polycarbonate layer is obtained.

In one embodiment, the etch layer is formed with chromium. In this embodiment, a process gas is ionized to produce a low pressure-high density plasma which contains chemically active oxygen-containing ions and chemically active chlorine-containing ions.

The etch layer can alternatively be formed with aluminum. In this embodiment, a process gas is ionized to produce a low pressure-high density plasma which contains a combination of chemically active oxygen-containing ions, chlorine-containing ions and bromine-containing ions.

The etch layer can also be formed with molybdenum. In this embodiment, a process gas is ionized to produce a low pressure-high density plasma which contains a combination of chemically active fluorine-containing ions, nitrogen-containing ions, hydrogen-containing ions and oxygen-containing ions.

The etch layer can also be formed with tantalum. In this embodiment, a process gas is ionized to produce a low pressure-high density plasma which contains a combination of chemically active fluorine-containing ions and chlorine-containing ions.

Furthermore, the etch process of the present invention can be used to etch an electrically insulating etch layer such as a silicon nitride, silicon oxide, or glass layer. The electrically insulating etch layer is etched by ionizing a process gas to produce a low pressure-high density plasma which contains chemically active fluorine-containing ions.

The etch method can be performed in a transformer coupled plasma apparatus in which the low pressure-high density plasma is generated by coupling RF power to a remote induction coil. Alternatively, the etch method can be performed in an electron cyclotron resonance apparatus or in a helicon wave apparatus.

The etch structure can be heated to increase the etch rate. The etch structure is typically heated to a temperature of at least approximately 20° C. Further, the etch structure is heated to a temperature no higher than 5° C. below the glass transition temperature of the polycarbonate layer.

Prior to etching the etch layer, the etch structure can be baked by heating the etch structure at subatmospheric pressure to remove volatile gases from the etch structure. Baking the etch structure reduces the amount of outgassing from the etch structure during the etch of the etch layer. This increases the reactive ion concentration at the etch layer, and hence increases the etch rate. The etch structure can also be plasma precleaned to remove trace residue from the polycarbonate layer.

The etch structure can be biased to attract reactive ions to the etch structure. This increases the concentration of reactive ions at the etch layer, and hence increases the etch rate.

An inert gas can be added to the process gas mixture. The inert gas decreases the reactive ion concentration at the etch layer, and hence decreases the etch rate.

The etch method of the invention can be used to fabricate gated electron emitters. In one example, an electrically insulating layer underlies an electrically non-insulating (ENI) etch layer, and a second ENI layer underlies the electrically insulating layer. As used here, ENI generally means electrically conductive or electrically resistive. The ENI etch layer is then etched in accordance with the present invention. Subsequent to the etch, dielectric open spaces are created in the electrically insulating layer. Electron-emissive elements are then formed in the dielectric open spaces in such a way that each electron-emissive element contacts the second ENI layer.

BRIEF DESCRIPTION OF THE DRAWINGS

FIG. 2b is a cross-sectional view illustrating a conventional reactive ion etch of a single aperture in FIG. 2a.

DESCRIPTION OF THE PREFERRED EMBODIMENTS

This invention provides a method of plasma etching using a polycarbonate mask and low pressure-high density plasma.

In the following description, the term "electrically insulating" (or "dielectric") generally applies to materials having a resistivity greater than $10^{10}$ ohm-cm. The term "electrically non-insulating" (hereinafter ENI) thus refers to materials having a resistivity below $10^{10}$ ohm-cm. ENI materials are divided into (a) electrically conductive materials for which the resistivity is less than 1 ohm-cm and (b) electrically resistive materials for which the resistivity is in the range of 1 ohm-cm to $10^{10}$ ohm-cm. These categories are determined at an electric field of no more than 1 volt/$\mu$m.

Examples of electrically conductive materials (or electrical conductors) are metals, metal-semiconductor compounds (such as metal silicides), and metal-semiconductor eutectics. Electrically conductive materials also include semiconductors doped (n-type or p-type) to a moderate or high level. Electrically resistive materials include intrinsic and lightly doped (n-type or p-type) semiconductors. Further examples of electrically resistive materials are (a) metal-insulator composites, such as cermet (ceramic with embedded metal particles), (b) forms of carbon such as graphite, amorphous carbon, and modified (e.g. doped or laser-modified) diamond, (c) and certain silicon-carbon compounds such as silicon-carbon-nitrogen.

Figure 1:
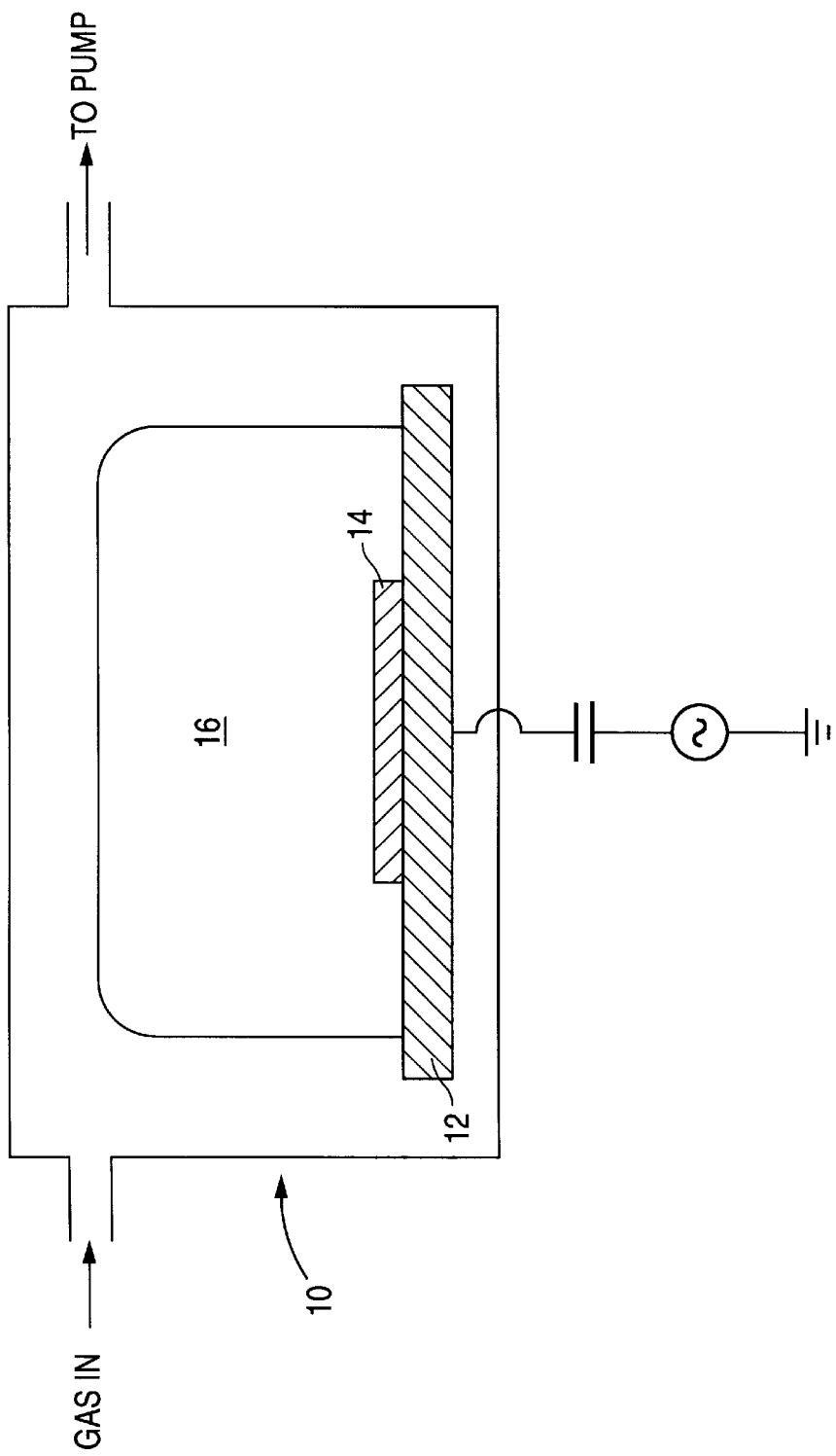
FIG. 1 is a schematic representation of a conventional reactive ion etch reactor.
Figure 2A:
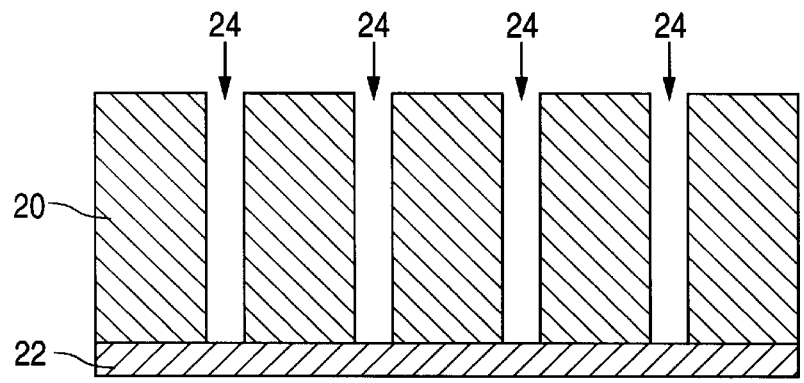
FIG. 2a is a cross-sectional view of a conventional etch structure in which a mask having apertures overlies an etch layer.
Figure 2B:
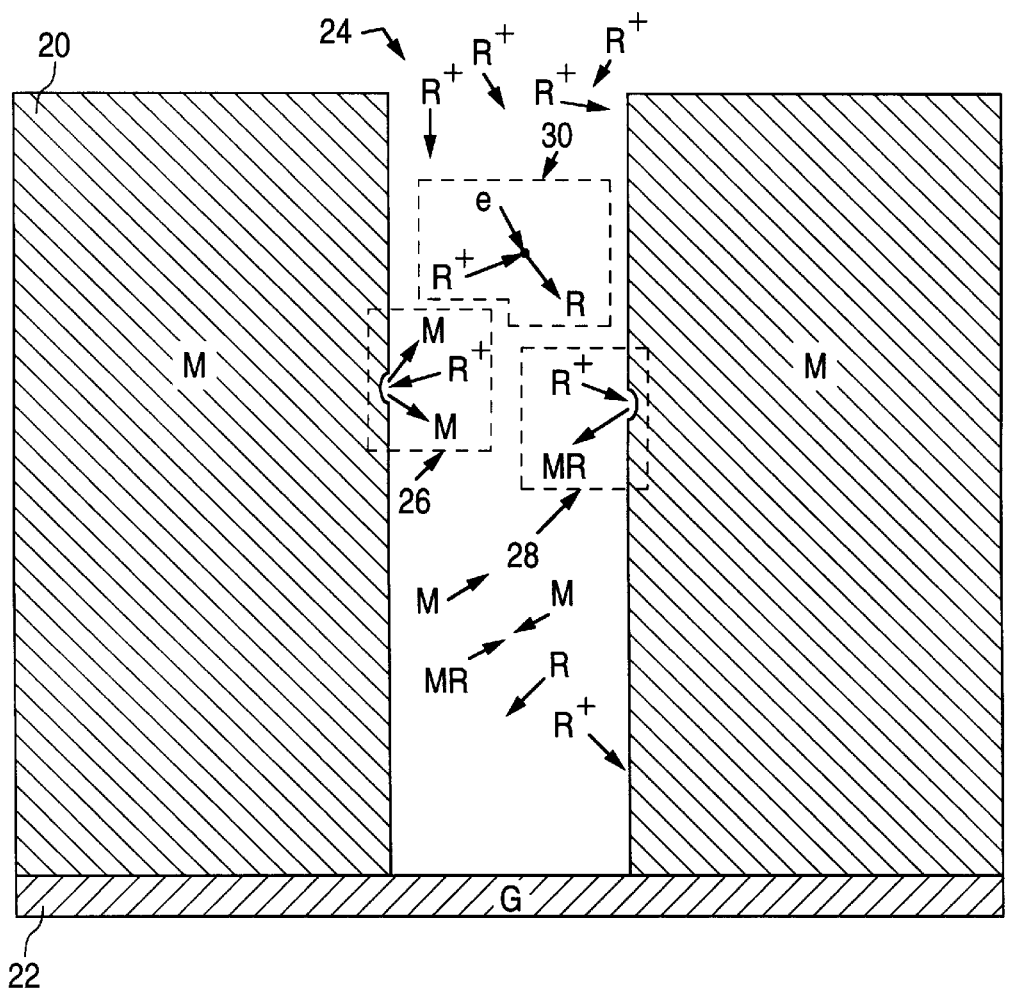
Figure 3:
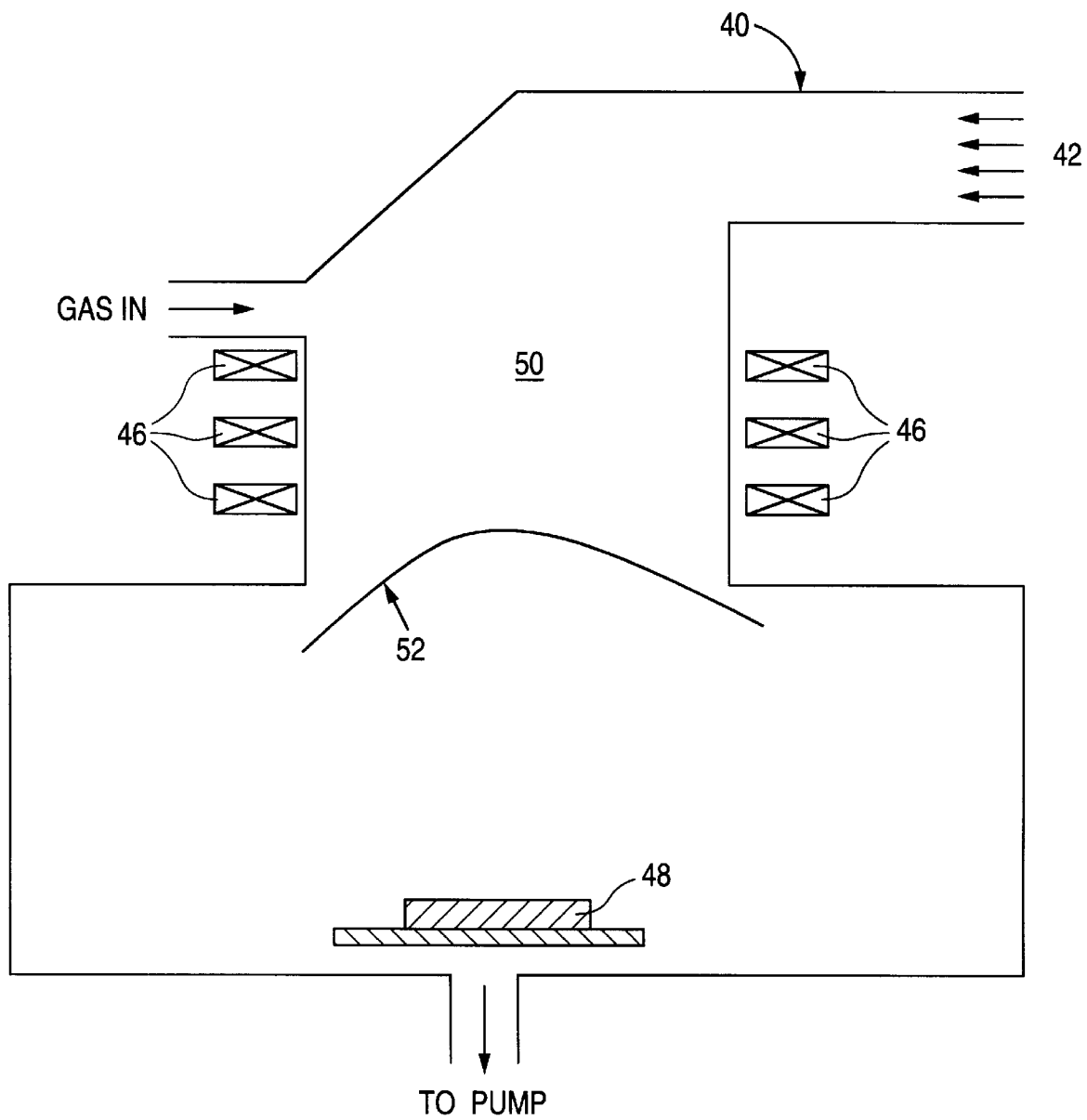
FIG. 3 is a schematic representation of a conventional electron cyclotron resonance waveguide apparatus.
Figure 4:
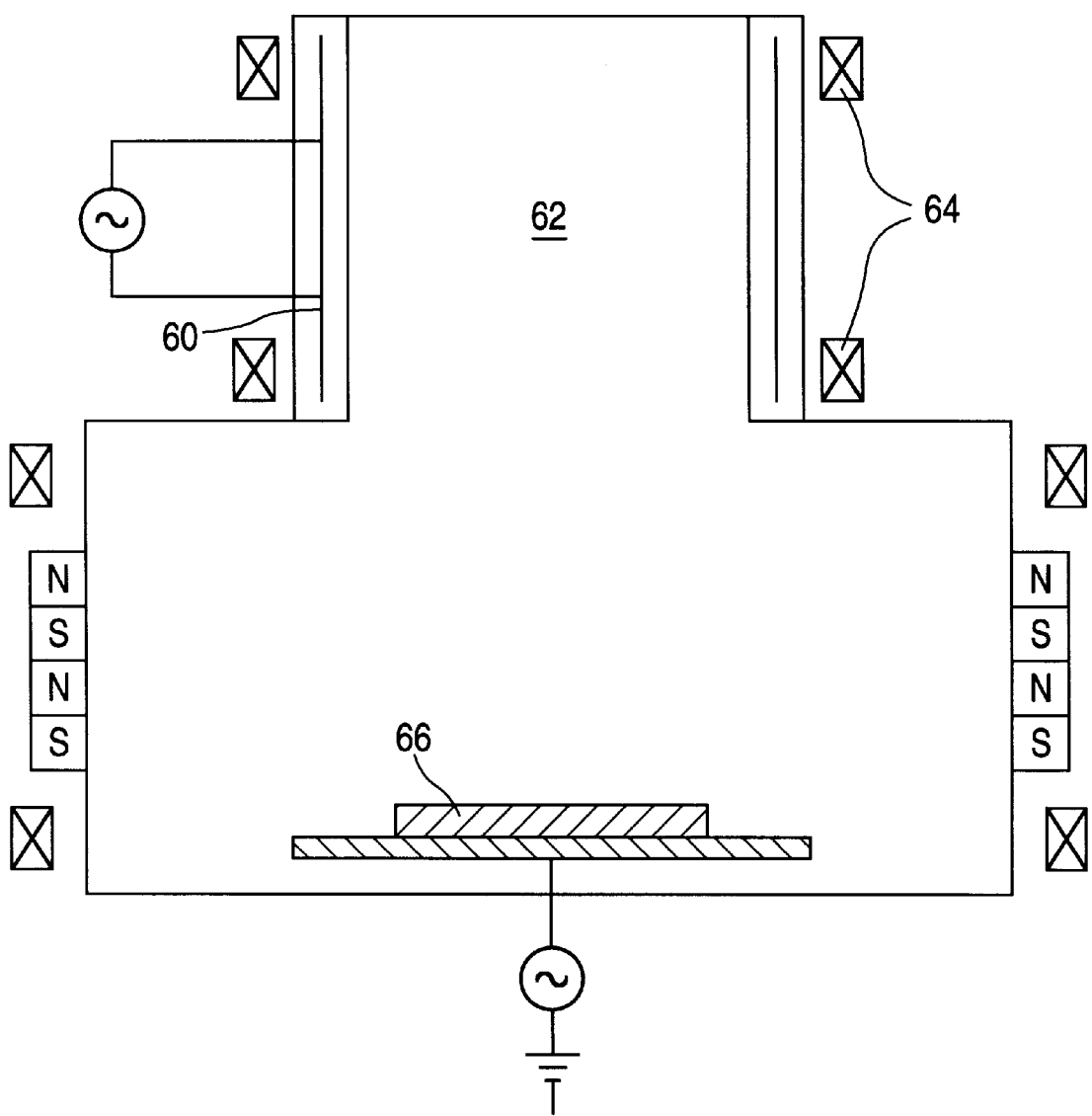
FIG. 4 is a schematic representation of a conventional helicon wave plasma apparatus.
Figure 5:
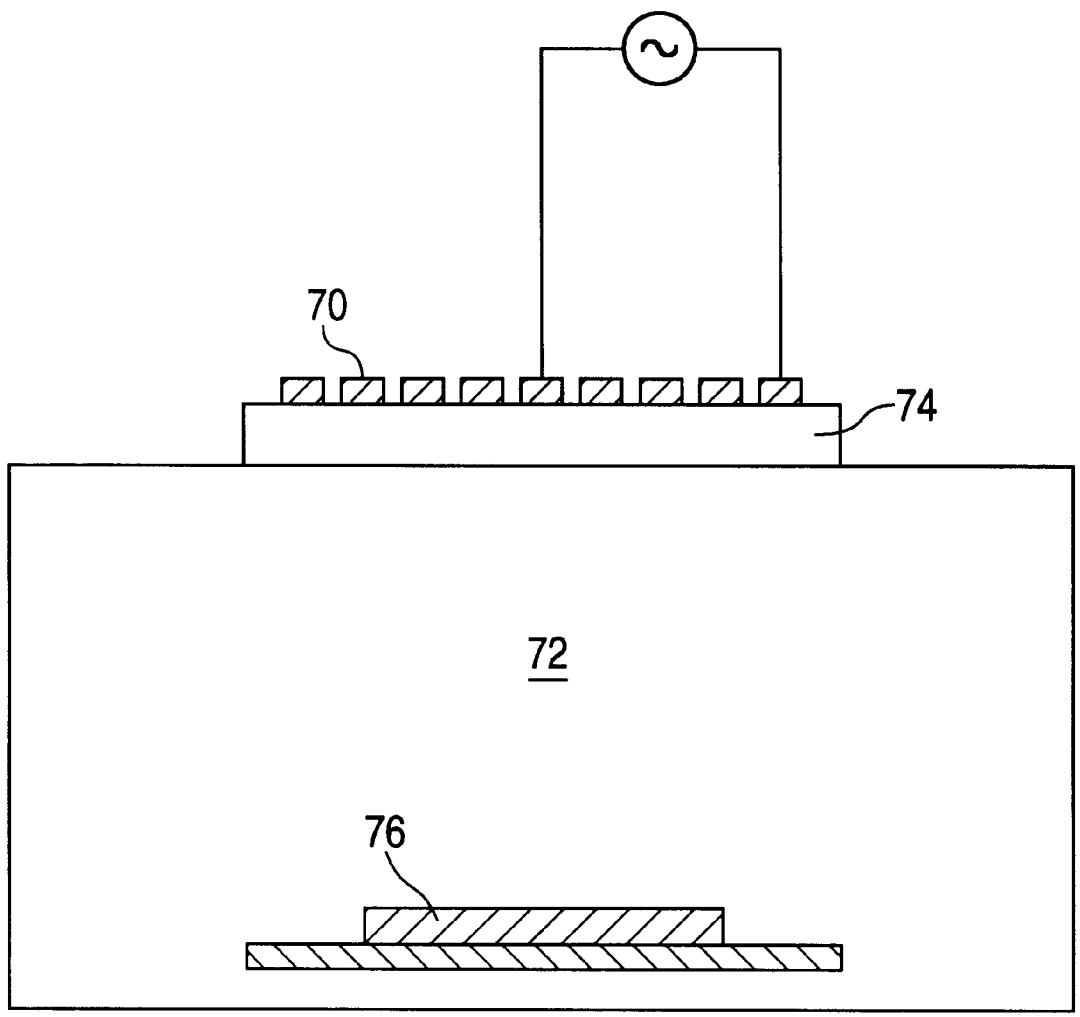
FIG. 5 is a schematic representation of a conventional inductively coupled plasma apparatus which uses a spiral coupler.
Figure 6A:
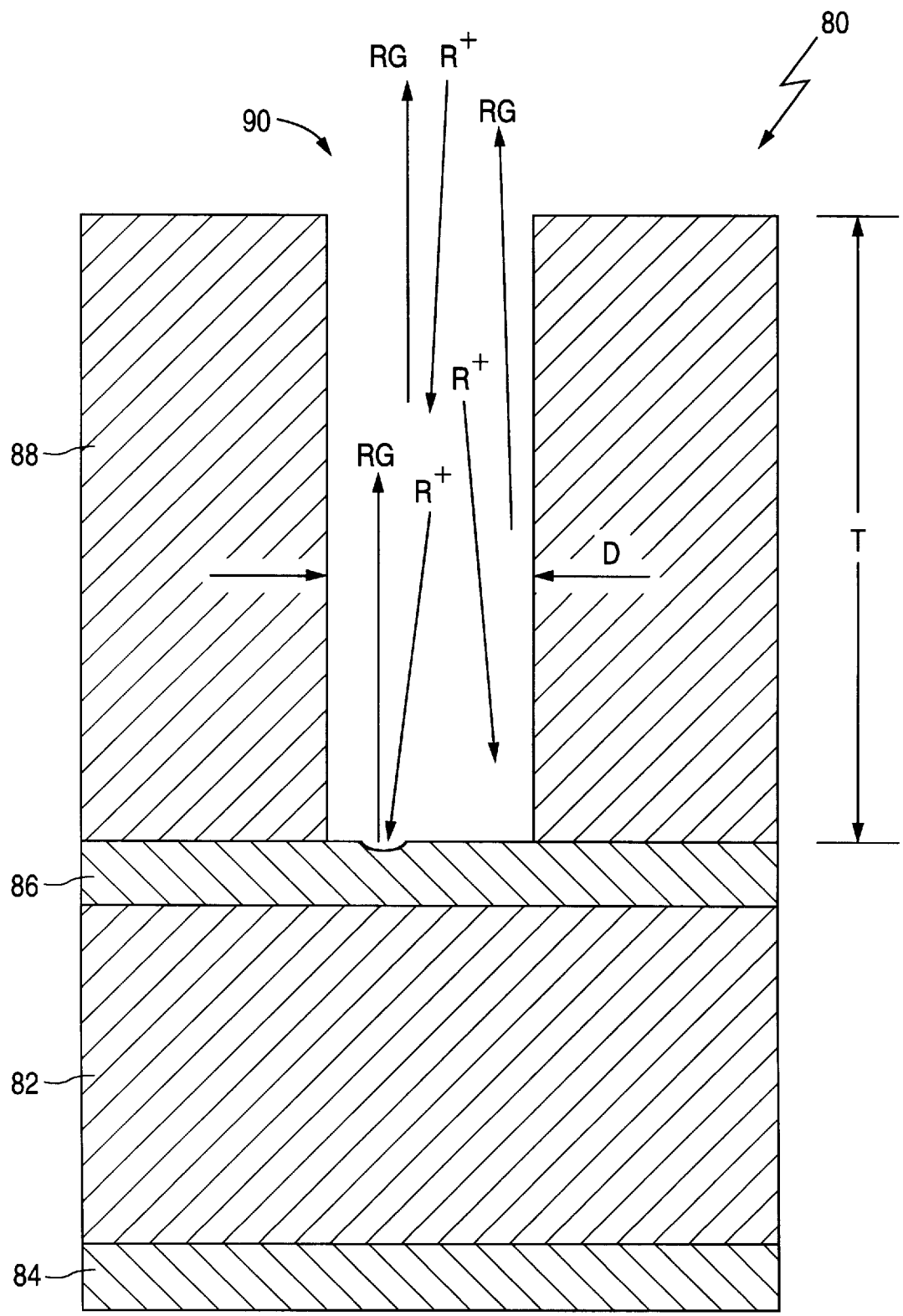
FIGS. 6a and 6b are cross-sectional views of an etch structure during and after a low pressure-high density plasma etch in accordance with the present invention.

A cross sectional view of an exemplary etch structure 80 for the present etch is shown in FIG. 6a. Etch structure 80 includes electrically insulating layer 82 overlying ENI layer 84. Etch layer 86, preferably consisting of metal, lies over electrically insulating layer 82. Polycarbonate layer 88 lies over etch layer 86, polycarbonate layer 88 including a multiplicity of apertures, a single one of which is shown as item 90. As shown in FIG. 6a, aperture 90 has a diameter D. Diameter D is typically 0.30 $\mu$m or 0.12–0.16 $\mu$m although diameter D can have other dimensions, and in particular can be less than 0.12 $\mu$m. Diameter D normally lies in the range of 0.1–2.0 $\mu$m. Polycarbonate layer 88 also has a thickness T which is generally 400 nm to 700 nm, preferably 560 nm, although thickness T can have other dimensions.

Polycarbonate layer 88 can be formed using the method described in Porter et al., cofiled U.S. patent application Ser. No. 08/808,363, the contents of which are incorporated by reference herein. One technique for forming the apertures is to subject etch structure 80 to charged particles to form a multiplicity of charged-particle tracks through etch structure 80 and then etch polycarbonate layer 88 along the charged-particle tracks in the manner generally described in Macaulay et al., PCT Patent Publication WO 95/07543 or in Porter et al., cofiled U.S. patent application Ser. No. 08/807,456, the contents of which are also incorporated by reference herein.

After placing etch structure 80 into a reaction chamber, the exposed part of etch layer 86 is etched through aperture 90 using a low pressure-high density plasma in accordance with the teachings of the invention. The low pressure-high density plasma is generated at a pressure in the range of approximately 1 to 30 millitorr (mtorr), preferably 1 to 20 mtorr, where the ionized particle concentration is: (1) at least $10^{11}$ ions/cm$^3$ and (2) substantially equal throughout the entire reaction chamber volume, i.e., the entire volume of the reaction chamber is uniformly ionized.

Figure 6B:
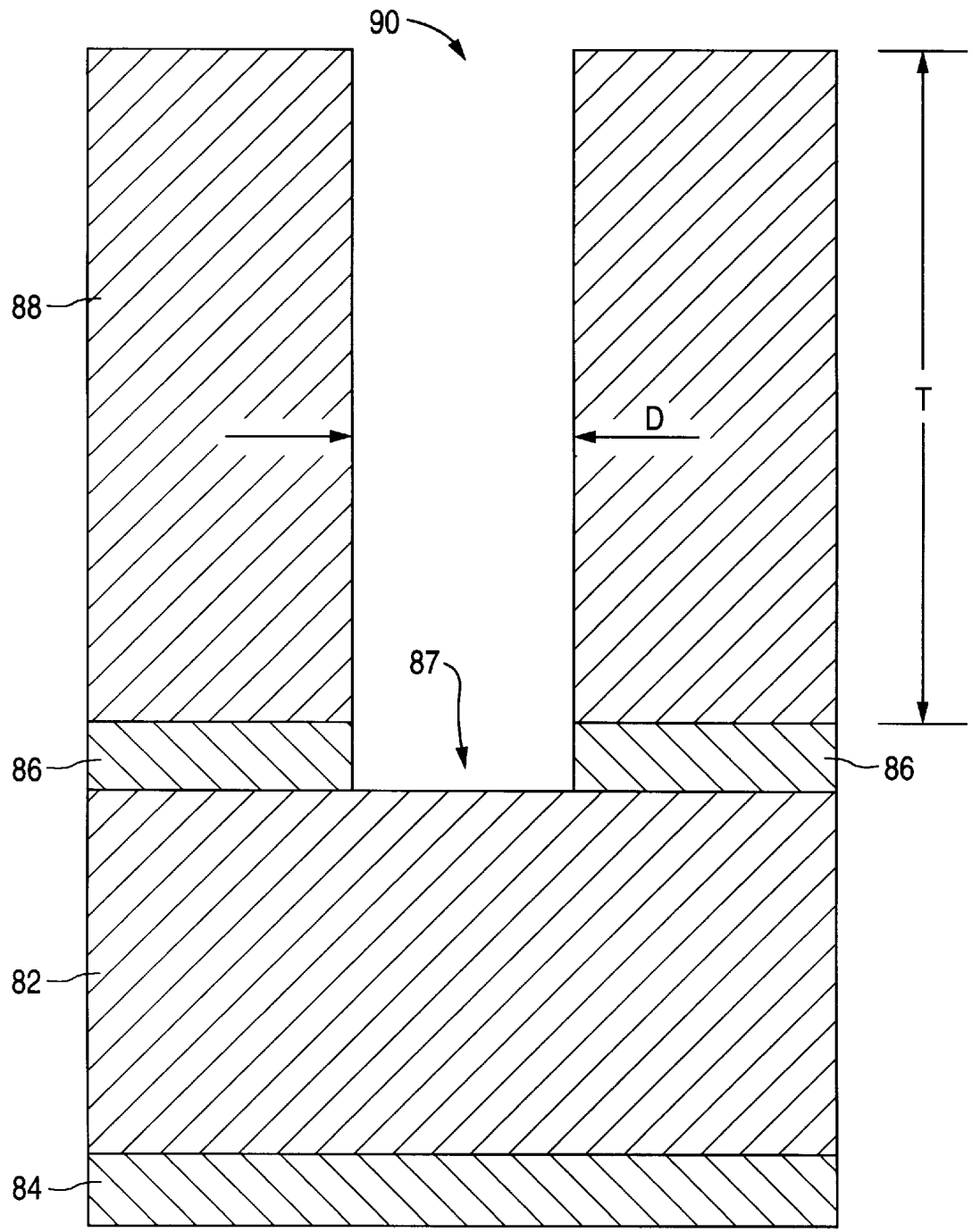

The mechanism responsible for the etch of the invention is explained in reference to FIGS. 6a and 6b as follows. FIGS. 6a and 6b are cross-sectional views of an etch structure during and after a low pressure-high density plasma etch in accordance with the present invention, respectively. Referring to FIG. 6a, reducing the pressure to a low value causes the mean free path (MFP) of reactive ions, again shown as R$^+$, to increase. As reactive ions R$^+$ travel through aperture 90 in mask 88, they are subject to less collisions with the side walls of mask 88 and with other gas molecules because of the increased MFP. Thus, more reactive ions R$^+$ reach etch layer 86 to form reaction product gases, shown as RG. This results in two primary advantages.

First, selectivity is enhanced. As shown in FIG. 6b, the diameter of the opening 87 in etch layer 86 is approximately equal to diameter D of aperture 90, i.e., etch layer 86 has an etch selectivity of nearly 100% relative to mask 88. This is due to (a) the increase in chemical reactions between reactive ions R$^+$ and etch layer 86 and (b) the decrease in interactions of reactive ions R$^+$ with the polycarbonate side walls and with other gas molecules.

Second, etch rates are improved due to the increased concentration of reactive ions R$^+$ at etch layer 86 and the higher efficiency in the release of reaction product gases RG.

Figure 7:
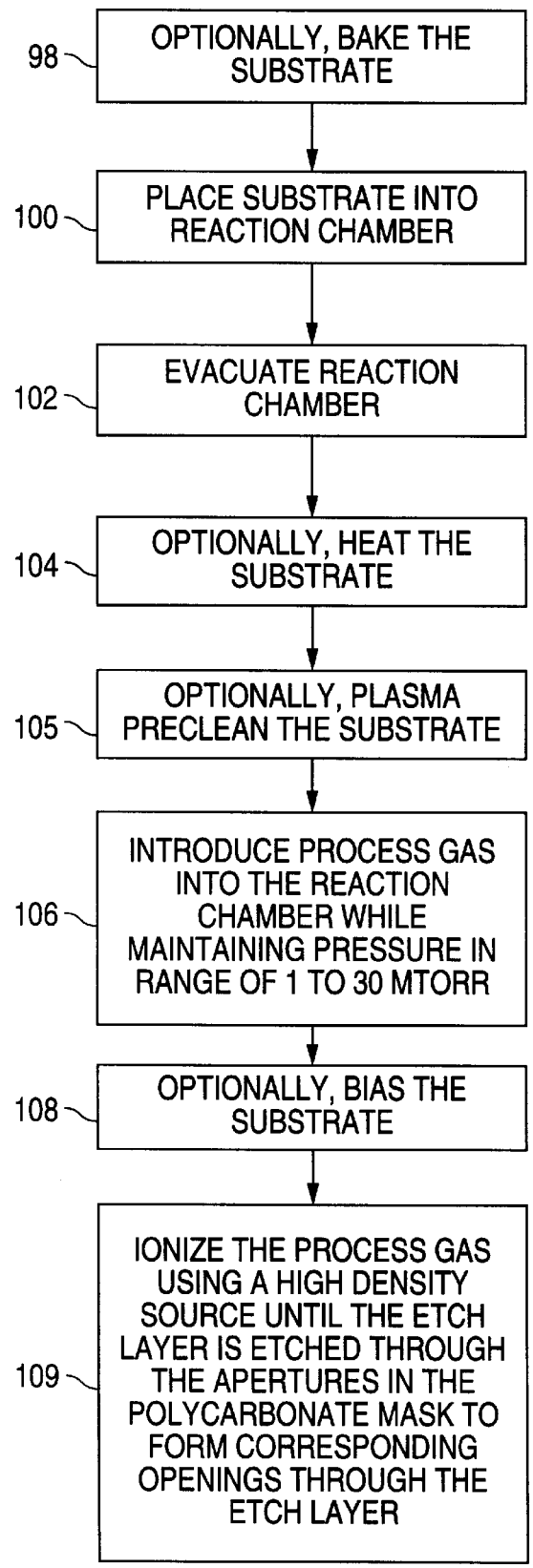
FIG. 7 is a flowchart of the primary steps involved in etching an etch layer using a polycarbonate mask and low pressure-high density plasma in accordance with the present invention.

Presented in FIG. 7 is a flowchart of the primary steps involved in etching an etch layer using a polycarbonate mask and low pressure-high density plasma in accordance with the present invention. Optionally, the first step, as indicated in block 98, is to bake an etch structure, such as that of FIG. 6a. The next step in the etch, as indicated in block 100, is to place the etch structure into the reaction chamber. The reaction chamber is then evacuated, as indicated in block 102.

Optionally, as indicated in block 104, the etch structure can be heated.

Optionally, as indicated in block 105, the etch structure can be plasma precleaned.

While maintaining the reactor pressure in the range of 1 to 30 mtorr, preferably 1 to 20 mtorr, process gas suitable for etching the etch layer is introduced into the reaction chamber, as indicated in block 106.

Optionally, as indicated in block 108, the etch structure can be biased.

Finally, the process gas is ionized to generate a low pressure-high density plasma until the etch layer is etched through the apertures in the polycarbonate mask to form corresponding openings through the etch layer, as indicated in block 109.

Referring to FIG. 6b, if etch layer 86 is an ENI layer, the structure resulting from the etch in accordance with the present invention can be used in fabricating gated electron emitters. Gated electron emitters can be fabricated by subsequently etching insulating layer 82 through the opening 87 in etch layer 86 to create a corresponding dielectric open space through insulating layer 82. Preferably, etch layer 86 is used as an etch mask during the etch of insulating layer 82. Alternatively, the etch can be done along charged-particle tracks which are formed through insulating layer 82 when the structure is subjected to the charged particles and which are respectively in line with the charged-particle tracks through polycarbonate layer 88. In the dielectric open spaces, electron-emissive elements are then formed in such a way that each electron-emissive element contacts ENI layer 84. Fabrication of gated electron emitters is further described in Macaulay et al., PCT Patent Publication WO 95/07543, cited above, and in Porter et al., Ser. No. 08/807, 456, also cited above.

Figure 8:
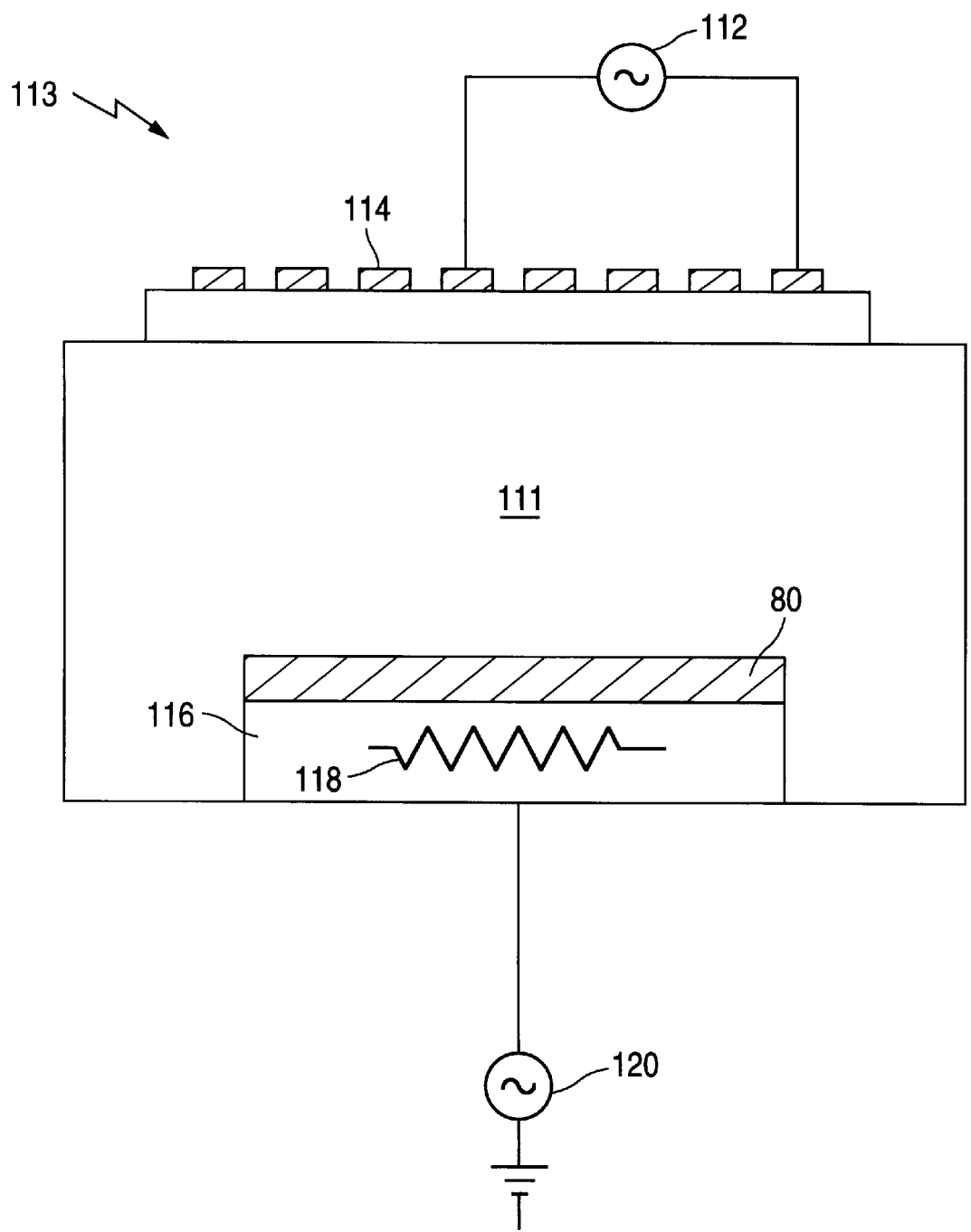
FIG. 8 is a schematic representation of a TCP apparatus used to perform a plasma etch in accordance with the present invention.

Referring to FIG. 8, in one embodiment, etch structure 80 using chromium (or a chromium containing material) as the etch layer 86 in FIG. 6a is placed into reaction chamber 111 of TCP apparatus 113. A suitable TCP apparatus includes LAM Research's 9400 Metal Etch System in which a 13.56 Megahertz (MHz) RF power generator 112 is coupled to remote induction coil 114, although other TCP apparatuses can be used.

Reaction chamber 111 is then evacuated. While maintaining the reaction chamber pressure within the range of 1–30 mtorr, typically 5 mtorr, process gas is introduced into reaction chamber 111. When ionized, the process gas produces a low pressure-high density plasma that contains chemically active oxygen-containing ions and chemically active chlorine-containing ions. The process gas can be a gas mixture which includes a gas that provides a source of oxygen-containing ions and a gas that provides a source of chlorine-containing ion. A suitable oxygen-containing ion source gas includes diatomic oxygen ($O_2$). Suitable chlorine-containing ion source gases include diatomic chlorine ($Cl_2$), hydrogen chloride (HCl) and boron trichloride ($BCl_3$). The volumetric flow ratio of chlorine-containing ion source gas to oxygen-containing ion source gas is greater than 4 to 1 and less than 40 to 1. Preferably, the volumetric flow ratio of chlorine-containing ion source gas to oxygen-containing ion source gas is 8 to 1. To illustrate, an 8 to 1 volumetric flow ratio is obtained by using 160 standard cubic centimeters per minute (sccm) of $Cl_2$ and 20 sccm of $O_2$. Gas flow rates are controlled using conventional mass flow controller.

The process gas is then ionized to generate a low pressure-high density plasma by coupling RF power from RF power generator 112 to remote induction coil 114. Generally, RF power levels within the range of 200 to 800 watts are used, with typical RF power levels in the range of approximately 300 to 500 watts. RF power coupling continues until the chromium etch layer is etched through.

In a second embodiment, an etch structure using aluminum (or an aluminum containing material) as the etch layer is placed into a TCP reaction chamber.

The reaction chamber is then evacuated. While maintaining the reaction chamber pressure within the range of 1 to 30 mtorr, preferably 1 to 20 mtorr, process gas is introduced into the reaction chamber. When ionized, the process gas produces a low pressure-high density plasma that contains one or more of the following: chemically active oxygen-containing ions, chlorine-containing ions and bromine-containing ions. The process gas can be a gas mixture. A suitable oxygen-containing ion source gas includes $O_2$. Suitable chlorine-containing ion source gases include $Cl_2$, HCl and $BCl_3$. Suitable bromine-containing ion source gases include diatomic bromine ($Br_2$) and hydrogen bromide (HBr).

RF power is then coupled to ionize the process gas and generate a low pressure-high density plasma until the aluminum etch layer is etched through.

In a third embodiment, an etch structure using molybdenum (or a molybdenum containing material) as the etch layer is placed into a TCP reaction chamber.

The reaction chamber is then evacuated. While maintaining the reaction chamber pressure within the range of 1 to 30 mtorr, preferably 1 to 20 mtorr, process gas is introduced into the reaction chamber. When ionized, the process gas produces a low pressurehigh density plasma that contains one or more of the following: chemically active fluorine-containing ions, nitrogen-containing ions, hydrogen-containing ions and oxygen-containing ions. The process gas can be a gas mixture. Suitable fluorine-containing ion source gases include carbon tetrafluoride ($CF_4$), trifluoromethane ($CHF_3$), hexafluoroethane ($C_2F_6$), octafluoropropane ($C_3F_8$), and sulfur hexafluoride ($SF_6$). Suitable nitrogen-containing ion source gases include diatomic nitrogen ($N_2$) and ammonia ($NH_3$). Suitable hydrogen-containing ion source gases include $CHF_3$ and HCl. A suitable oxygen-containing ion source gas includes $O_2$.

RF power is then coupled to ionize the process gas and generate a low pressure-high density plasma until the molybdenum etch layer is etched through.

In a fourth embodiment, an etch structure using tantalum (or a tantalum containing material) as the etch layer is placed into a TCP reaction chamber.

The reaction chamber is then evacuated. While maintaining the reaction chamber pressure within the range of 1 to 30 mtorr, preferably 1 to 20 mtorr, process gas is introduced into the reaction chamber. When ionized, the process gas produces a low pressure-high density plasma that contains one or more of the following: chemically active fluorine-containing ions and chlorine-containing ions. The process gas can be a gas mixture. Suitable fluorine-containing ion source gases include $CF_4$, $CHF_3$, $C_2F_6$, $C_3F_8$, and $SF_6$. Suitable chlorine-containing ion source gases include $Cl_2$, HCl and $BCl_3$.

RF power is then coupled to ionize the process gas and generate a low pressure-high density plasma until the tantalum etch layer is etched through.

In the four embodiments described above, the etch layer is an ENI layer. However, an etch in accordance with the present invention can also be used to etch an electrically insulating etch layer such as a silicon nitride ($Si_3N_4$), silicon oxide ($SiO_2$) or, glass layer. To etch an electrically insulating etch layer, an etch structure having the electrically insulating etch layer is placed into a TCP reaction chamber.

The reaction chamber is then evacuated. While maintaining the reaction chamber pressure within the range of 1 to 30 mtorr, preferably 1 to 20 mtorr, process gas is introduced into the reaction chamber. When ionized, the process gas produces a low pressure-high density plasma containing chemically active fluorine-containing ions. The process gas can be a gas mixture of fluorine-containing ion source gases such as $CF_4$, $CHF_3$, $C_2F_6$, $C_3F_8$ and $SF_6$, and preferably is a gas mixture of $CHF_3$ and $CF_4$.

RF power is then coupled to ionize the process gas and generate a low pressure-high density plasma until the electrically insulating etch layer is etched through.

In all of the embodiments, prior to placing the etch structure into the reaction chamber, the etch structure can be baked. Baking involves heating the etch substrate to an elevated temperature typically less than or equal to 65° C., for example to 55° C., although the etch structure can be heated to other temperatures. The etch substrate is baked for an amount of time sufficient to drive off a substantial amount of the gases within the etch structure (i.e., to degas the etch structure). To enhance the degassing, the bake is generally performed at subatmospheric pressure.

Referring to FIG. 6a, baking etch structure 80 prior to etching etch layer 86 reduces outgassing of trapped gases into aperture 90 during the etch of etch layer 86. This increases the reactive ion $R^+$ concentration at each layer 86, and hence increases the etch rate.

Baking the etch structure becomes increasingly important when diameter D (FIG. 6a) is less than 0.30 $\mu$m. To illustrate, it has been found that when 0.12 $\mu$m diameter apertures are formed in MAKROLON® 2608 polycarbonate, water vapor trapped in the polycarbonate outgasses during the etch of the etch layer thus significantly decreasing the etch rate. However, it has been found that baking this etch structure at 55° C. at a pressure of approximately 508 torr for 1 hour to 3 hours improves the etch rate.

The etch structure is typically baked in a load-lock chamber of the reaction chamber. In this manner, the etch substrate is transferred to the reaction chamber without exposing the etch substrate to the ambient atmosphere after the etch substrate is baked. Alternatively, the etch substrate can be baked in the reaction chamber. In this alternative, block 98 (FIG. 7) follows block 102, i.e., the etch substrate is placed into the reaction chamber, the reaction chamber is evacuated and the etch substrate is baked.

In all of the embodiments, the etch structure can be heated to increase the etch rate. Referring to FIG. 8, to heat the etch structure 80, an electrode 116 upon which etch structure 80 is placed has contained within a conventional resistive heating element 118. Resistive heating element 118 heats electrode 116, and hence etch structure 80.

The etch structure is generally heated to at least 20° C., and is typically heated to 60° C. when the diameter (D in FIG. 6a) of the apertures in the polycarbonate layer is approximately 0.30 µm or greater. Further, the etch structure temperature must not exceed the temperature at which damage to the polycarbonate layer occurs. In particular, the etch structure temperature should be no more than approximately a temperature $T_{TG-5}$ to prevent physical deformation of the polycarbonate layer, where temperature $T_{TG-5}$ is equal to 5° C. below the glass transition temperature of the polycarbonate. The glass transition temperature of polycarbonate is typically within the range of 120° C. to 170° C. To illustrate, MAKROLON® 2608 polycarbonate has a glass transition temperature of approximately 145° C. Thus, when MAKROLON® 2608 is used to form the polycarbonate layer, the etch structure temperature should be in a temperature range having a lower boundary of approximately 20° C. and an upper boundary of approximately 140° C.

When the diameter (D in FIG. 6a) of the apertures in the polycarbonate mask is less than 0.30 µm, outgassing of trapped gases within the etch structure during the step of heating the etch substrate can significantly deceases the etch rate. Thus, when the diameter of the apertures in the polycarbonate mask is less than 0.30 µm, it is desirable to heat the etch substrate to enhance the etch rate without causing significant outgassing. This is accomplished by heating the substrate to a temperature in the range of approximately 20° C. to 40° C., preferably 20° C.

Note as specified in Porter et al., Ser. No. 08/807,456, cited above, that the polycarbonate layer can, during its preparation, be annealed at a temperature up to 15° C. above the polycarbonate glass transition temperature and subsequently quenched in order to change the polycarbonate from an initially glass-like microstructure having some short-range molecular ordering to a microstructure having largely no molecular ordering (no short-range or long-range molecular ordering). When this anneal is performed, subsequent thermal processing that could cause the polycarbonate layer to transition out of the largely non-ordered microstructure is normally avoided.

In all of the embodiments, an inert gas such as argon can be added to the process gas mixture to reduce the speed of the etch. The inert gas decreases the concentration of reactive ions. Since the speed of the etch decreases as the concentration of reactive ions decreases, adding an inert gas decreases the etch rate.

In all of the embodiments, the etch substrate can be plasma precleaned to remove trace residue from the polycarbonate mask which may obstruct the apertures in the polycarbonate mask. To perform a plasma preclean, an oxidizing gas such as $O_2$ is introduced into the reaction chamber while maintaining the reaction chamber pressure at a subatmospheric pressure, for example within the range of 1–30 mtorr. The oxidizing gas is then ionized to remove trace residue from the polycarbonate mask. As an example, $O_2$ is ionized for 30 seconds by coupling RF power from RF power generator 112 (FIG. 8) to remote induction coil 114 with an RF power level of 100 watts.

Referring again to FIG. 7, the plasma preclean step, as indicated in block 105, can alternatively precede the heating step as indicated in block 104. As another alternative, the plasma preclean step, as indicated in block 105, can be performed in a load-lock chamber of the reaction chamber. In this alternative, the plasma preclean step, as indicated in block 105, precedes the step of placing the etch substrate into the reaction chamber, as indicated in block 100.

In all of the embodiments, the etch structure can be biased to attract reactive ions and increase the etch rate. Referring to FIG. 8, a 13.56-MHz RF generator 120 is used to couple RF power to electrode 116, which biases etch structure 80. Generally, the RF power level used to bias etch structure 80 is less than or equal to 80 watts. By attracting reactive ions, the etch rate is increased. Of importance, to maintain the selectivity between the etch layer and the polycarbonate mask, the etch structure bias must not impart an energy to the attracted ions sufficient to cause significant etching of the etch structure 80 through momentum transfer upon being hit by the attracted ions.

In alternative embodiments, other techniques for generating a low pressure-high density plasma can be used. These techniques including ECR and helicon wave technologies. Other ICP configurations can also be employed.

A load-locked reaction chamber can also be used, i.e., a reaction chamber having an attached load-lock chamber. In this embodiment, the reaction chamber is maintained at subatmospheric pressure. The etch substrate is loaded into the load-lock chamber. The load-lock chamber is then evacuated. The etch substrate is then transferred into the reaction chamber from the load-lock chamber. This procedure is reversed to remove the etch substrate from the reaction chamber. Of course, more than one load-lock chamber can be used such as entrance and exit load-lock chambers. Further, the exit load-lock chamber can have conventional cooling capability to cool the etch substrate upon removal from the reaction chamber. Referring to FIG. 7, in this embodiment the step of evacuating the reaction chamber, as indicated in block 102, is unnecessary since the reaction chamber is maintained at subatmospheric pressure.

Although the present invention has been described with reference to preferred embodiments, persons skilled in the art will recognize that changes may be made in form and detail without departing from the spirit and scope of the invention.

We claim:

1. An etching method comprising the steps of:
   placing an etch structure in a reaction chamber, the etch structure including an etch layer and a polycarbonate layer through which apertures extend, the etch layer underlying the polycarbonate layer;
   biasing the etch structure; and
   etching the etch layer through the apertures with a low pressure-high density plasma, the step of biasing being initiated before the step of etching, wherein the low pressure-high density plasma is generated at a pressure in the range of approximately 1 to 30 millitorr and wherein the low pressure-high density plasma has an ionized particle concentration of at least $10^{11}$ ions/cm$^3$.

2. The method of claim 1 wherein the pressure is in the range of approximately 1 to 20 millitorr.

3. The method of claim 1 wherein the ionized particle concentration is substantially equal throughout the reaction chamber.

4. The method of claim 1 wherein the etch structure further includes (a) an electrically insulating layer underlying the etch layer and (b) an electrically non-insulating (ENI) layer underlying the electrically insulating layer.

5. The method of claim 1 wherein the apertures are formed by causing charged particles to pass through the polycarbonate layer to form a multiplicity of charged-particle tracks therethrough, the polycarbonate layer thereafter being etched along the charged-particle tracks.

6. The method of claim 1 wherein the etch layer comprises chromium.

7. The method of claim 6 further including the step of generating the low pressure-high density plasma by ionizing a gas mixture which includes a first gas that provides a source of chlorine-containing ions and a second gas that provides a source of oxygen-containing ions.

8. The method of claim 7 wherein the volumetric flow ratio of the first gas to the second gas is greater than four to one and less than forty to one.

9. The method of claim 7 wherein the first gas is selected from the group consisting of chlorine, hydrogen chloride and boron trichloride and wherein the second gas is oxygen.

10. The method of claim 1 wherein the etch layer comprises aluminum.

11. The method of claim 10 further including the step of generating the low pressure-high density plasma by ionizing a gas mixture which includes a combination of a first gas that provides a source of chlorine-containing ions, a second gas that provides a source of oxygen-containing ions and a third gas that provides a source of bromine-containing ions.

12. The method of claim 11 wherein the first gas is selected from the group consisting of chlorine, hydrogen chloride and boron trichloride, wherein the second gas is oxygen and wherein the third gas is selected from the group consisting of bromine and hydrogen bromide.

13. The method of claim 1 wherein the etch layer comprises molybdenum.

14. The method of claim 13 further including the step of generating the low pressure-high density plasma by ionizing a gas mixture which includes a combination of a first gas that provides a source of fluorine-containing ions, a second gas that provides a source of nitrogen-containing ions, a third gas that provides a source of hydrogen-containing ions and a fourth gas that provides a source of oxygen-containing ions.

15. The method of claim 14 wherein the first gas is selected from the group consisting of carbon tetrafluoride, trifluoromethane, hexafluoroethane, octafluoropropane and sulfur hexafluoride, wherein the second gas is selected from the group consisting of nitrogen and ammonia, wherein the third gas is selected from the group consisting of trifluoromethane and hydrogen chloride and wherein the fourth gas is oxygen.

16. The method of claim 1 wherein the etch layer comprises tantalum.

17. The method of claim 16 further including the step of generating the low pressure-high density plasma by ionizing a gas mixture which includes a combination of a first gas that provides a source of fluorine-containing ions and a second gas that provides a source of chlorine-containing ions.

18. The method of claim 17 wherein the first gas is selected from the group consisting of carbon tetrafluoride, trifluoromethane, hexafluoroethane, octafluoropropane and sulfur hexafluoride and wherein the second gas is selected from the group consisting of chlorine, hydrogen chloride and boron trichloride.

19. The method of claim 1 wherein the etch layer is an electrically insulating material.

20. The method of claim 19 wherein the electrically insulating material is selected from the group consisting of silicon nitride, silicon oxide, and glass.

21. The method of claim 20 further including the step of generating the low pressure-high density plasma by ionizing a gas mixture which includes a gas that provides a source of fluorine-containing ions.

22. The method of claim 21 wherein the gas is selected from the group consisting of carbon tetrafluoride, trifluoromethane, hexafluoroethane, octafluoropropane and sulfur hexafluoride.

23. The method of claim 1 further including the step of generating the low pressure-high density plasma by ionizing a gas mixture which includes an inert gas.

24. The method of claim 23 wherein the inert gas is argon.

25. The method of claim 1 wherein, during etching step, the etch layer has an etch selectivity of nearly 100% relative to the polycarbonate layer.

26. The method of claim 1 further including the step of heating the etch structure.

27. The method of claim 26 wherein the step of heating entails heating the etch structure to a temperature in a temperature range having a lower boundary of approximately 20° C. and an upper boundary of approximately 5° C. below the glass transition temperature of the polycarbonate layer.

28. The method of claim 27 wherein the glass transition temperature is in the range of approximately 120° C. to 170° C.

29. The method of claim 27 wherein the step of heating entails heating the etch structure to a temperature in the range of approximately 20° C. to 40° C.

30. The method of claim 29 wherein each of the apertures has a diameter of less than 0.30 $\mu$m.

31. The method of claim 1 wherein the reaction chamber is part of an inductively coupled plasma apparatus.

32. The method of claim 31 wherein the low pressure-high density plasma is generated by coupling radio frequency (RF) power to a remote induction coil.

33. The method of claim 32 wherein the RF power is in the range of approximately 200 to 800 watts.

34. The method of claim 1 wherein the reaction chamber is part of an electron cyclotron resonance apparatus.

35. The method of claim 1 wherein the reaction chamber is part of a helicon wave apparatus.

36. The method of claim 1 further including the step of baking the etch structure.

37. The method of claim 36 wherein the step of baking is initiated before the step of placing the etch structure in the reaction chamber.

38. The method of claim 36 wherein the step of baking is performed at subatmospheric pressure.

39. An etching method comprising the steps of:
placing an etch structure in a reaction chamber, the etch structure including an etch layer and a polycarbonate layer through which apertures extend, the etch layer underlying the polycarbonate layer;
plasma precleaning the etch structure; and
etching the etch layer through the apertures with a low pressure-high density plasma, the step of plasma precleaning being initiated before the step of etching, wherein the low pressure-high density plasma is generated at a pressure in the range of approximately 1 to 30 millitorr and wherein the low pressure-high density plasma has an ionized particle concentration of at least $10^{11}$ ions/cm$^3$.

40. The method of claim 39 wherein the step of plasma precleaning is initiated before the step of placing the etch structure in the reaction chamber.

41. The method of claim 39 wherein the step of plasma precleaning includes the step of ionizing an oxidizing gas.

42. The method of claim 1 wherein the etch layer is a first electrically non-insulating (ENI) layer, the etch structure further comprising an electrically insulating layer underling the first ENI layer and a second ENI layer underlying the electrically insulating layer, wherein the step of etching creates openings in the first ENI layer corresponding to the apertures in the polycarbonate layer, the method further comprising the steps of:

etching the electrically insulating layer using the first ENI layer as a mask to form corresponding dielectric open spaces; and forming electron-emissive elements in the dielectric open spaces, the electron-emissive elements contacting the second ENI layer.

43. An etching method comprising the steps of:

placing an etch structure in a reaction chamber, the etch structure including an etch layer and a polycarbonate layer through which apertures extend, the etch layer underlying the polycarbonate layer;

heating the etch structure;

biasing the etch structure;

plasma precleaning the etch structure; and etching the etch layer through the apertures with a low pressure-high density plasma, the steps of heating, biasing and plasma precleaning being initiated before the step of etching, wherein the low pressure-high density plasma is generated at a pressure in the range of approximately 1 to 30 millitorr and wherein the low pressure-high density plasma has an ionized particle concentration of at least $10^{11}$ ions/cm$^3$.

44. The method of claim 43 further including the step of baking the etch structure, the step of baking being initiated before the step of placing the etch structure in the reaction chamber.

45. An etching method comprising the steps of:

placing an etch structure in a reaction chamber, the etch structure including an etch layer and a polycarbonate layer through which apertures extend, the etch layer underlying the polycarbonate layer, wherein the etch layer comprises an electrically non-insulating material selected from the group consisting of chromium, aluminum, molybdenum, and tantalum; and etching the etch layer through the apertures with a low pressure-high density plasma, wherein the low pressure-high density plasma is generated at a pressure in the range of approximately 1 to 30 millitorr and wherein the low pressure-high density plasma has an ionized particle concentration of at least 10 ions/cm$^3$.

* * * * *